US012640461B2

(12) United States Patent　　　　　(10) Patent No.:　US 12,640,461 B2
Chen et al.　　　　　　　　　　　　　(45) Date of Patent:　May 26, 2026

(54) ELECTRONIC DEVICE AND MANUFACTURING METHOD THEREOF

(71) Applicant: Innolux Corporation, Miaoli County (TW)

(72) Inventors: Ying-Jen Chen, Miaoli County (TW); Yan-Zheng Wu, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 211 days.

(21) Appl. No.: 18/409,747

(22) Filed: Jan. 10, 2024

(65) Prior Publication Data

US 2024/0275024 A1　　Aug. 15, 2024

Related U.S. Application Data

(60) Provisional application No. 63/444,236, filed on Feb. 9, 2023.

(30) Foreign Application Priority Data

Sep. 22, 2023　(CN) .......................... 202311233556.0

(51) Int. Cl.
　　*H01Q 1/22*　　　(2006.01)
　　*H01Q 1/38*　　　(2006.01)
　　　　　(Continued)
(52) U.S. Cl.
　　CPC ............. *H01Q 1/2283* (2013.01); *H01Q 1/38* (2013.01); *H10W 70/05* (2026.01); *H10W 70/685* (2026.01); *H10W 90/724* (2026.01)

(58) Field of Classification Search
　　CPC .......... H01Q 1/2283; H01Q 1/38; H01Q 1/24; H01Q 1/243; H01L 21/4857;
　　　　　　　　　(Continued)

(56) References Cited

U.S. PATENT DOCUMENTS 10,461,041 B2 * 10/2019 Chiu ................... H01L 23/3128
10,854,994 B2　12/2020 Niroo Jazi et al.
(Continued)

*Primary Examiner* — Daniel D Chang
(74) *Attorney, Agent, or Firm* — JCIPRNET

(57)　　　　　　ABSTRACT

An electronic device and a manufacturing method thereof are provided. The electronic device includes an antenna structure, a first circuit structure, and a chip. The antenna structure includes a first dielectric layer, a first metal pattern, a second dielectric layer, and a second metal pattern. The first dielectric layer has a first surface and a second surface. The first metal pattern is disposed on the first surface. The second dielectric layer is disposed on the first metal pattern. The second metal pattern is disposed on the second dielectric layer. The first circuit structure is disposed on the antenna structure, and includes a third dielectric layer, a first conductive layer, and a first pad. The third dielectric layer is disposed on the second surface and has a fourth surface away from the second surface. The first conductive layer is disposed on the fourth surface. The first pad is disposed on the first conductive layer. The chip is disposed on the first circuit structure and electrically connected to the first circuit structure. The first metal pattern is indirectly electrically connected to the first conductive layer. The electronic device and the manufacturing method thereof may increase a bandwidth, reduce warpage, or improve reliability.

18 Claims, 10 Drawing Sheets

(51) Int. Cl.
  *H10W 70/05* (2026.01)
  *H10W 70/685* (2026.01)
  *H10W 90/00* (2026.01)

(58) Field of Classification Search
  CPC ............... H01L 23/49822; H01L 24/16; H01L
    2224/16227; H01L 23/66; H01L 21/48;
      H01L 21/60
  See application file for complete search history.

(56) References Cited

U.S. PATENT DOCUMENTS

2010/0090903 A1  4/2010 Byun et al.
2018/0332151 A1* 11/2018 Kamgaing ........... H01Q 9/0414

* cited by examiner

ELECTRONIC DEVICE AND MANUFACTURING METHOD THEREOF

CROSS-REFERENCE TO RELATED APPLICATION

This application claims the priority benefit of U.S. provisional application Ser. No. 63/444,236, filed on Feb. 9, 2023 and China application serial no. 202311233556.0, filed on Sep. 22, 2023. The entirety of each of the above-mentioned patent applications is hereby incorporated by reference herein and made a part of this specification.

BACKGROUND

Technical Field

The disclosure relates to an electronic device and a manufacturing method thereof, and more particularly, to an electronic device and a manufacturing method thereof that may increase a bandwidth, reduce warpage, or improve reliability.

Description of Related Art

Electronic devices or splicing electronic devices have been widely applied to different fields, such as communication, display, vehicle, aviation, or the like. As the electronic devices develop vigorously, the development of the electronic devices moves toward thinness and lightweight. Therefore, the demand for higher reliability or quality of the electronic devices has increased.

SUMMARY

The disclosure provides an electronic device and a manufacturing method thereof, which may increase a bandwidth, reduce warpage, or improve reliability.

According to the embodiment of the disclosure, an electronic device includes an antenna structure, a first circuit structure, and a chip. The antenna structure includes a first dielectric layer, a first metal pattern, a second dielectric layer, and a second metal pattern. The first dielectric layer has a first surface and a second surface. The first metal pattern is disposed on the first surface. The second dielectric layer is disposed on the first metal pattern. The second metal pattern is disposed on the second dielectric layer. The first circuit structure is disposed on the antenna structure, and includes a third dielectric layer, a first conductive layer, and a first pad. The third dielectric layer is disposed on the second surface and has a fourth surface away from the second surface. The first conductive layer is disposed on the fourth surface. The first pad is disposed on the first conductive layer. The chip is disposed on the first circuit structure and electrically connected to the first circuit structure. The first metal pattern is indirectly electrically connected to the first conductive layer.

According to the embodiment of the disclosure, a manufacturing method of an electronic device includes the following. An antenna structure is formed. A first circuit structure is formed. The antenna structure and the first circuit structure are bonded. A chip is disposed on the first circuit structure, so that the chip is electrically connected to the first circuit structure. The antenna structure includes a first dielectric layer, a first metal pattern, a second dielectric layer, and a second metal pattern. The first dielectric layer has a first surface and a second surface. The first metal pattern is disposed on the first surface. The second dielectric layer is disposed on the first metal pattern. The second metal pattern is disposed on the second dielectric layer. The first circuit structure includes a third dielectric layer, a first conductive layer, and a first pad. The third dielectric layer is disposed on the second surface and has a fourth surface away from the second surface. The first conductive layer is disposed on the fourth surface. The first pad is disposed on the first conductive layer. The first metal pattern is indirectly electrically connected to the first conductive layer.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 1A:
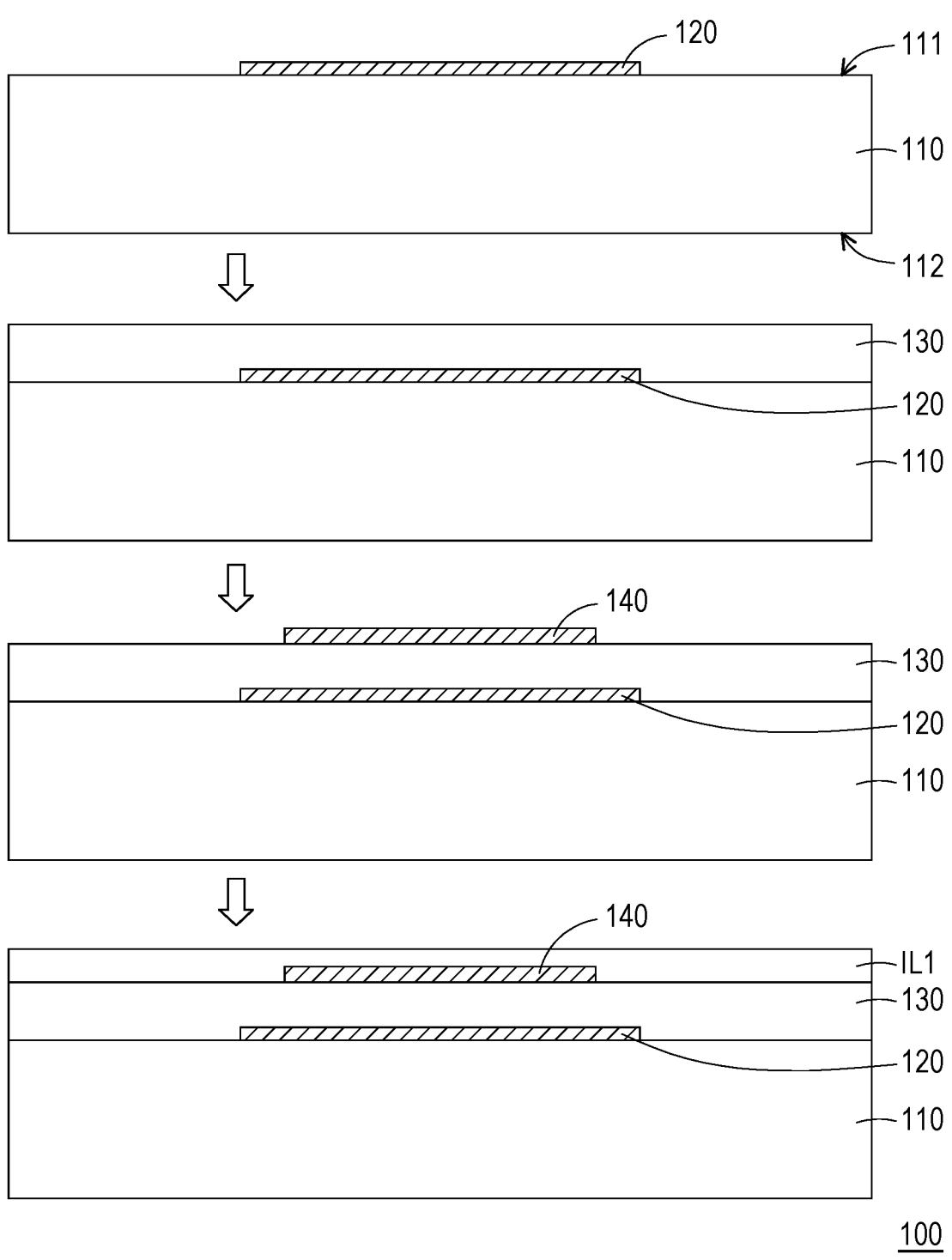
FIG. 1A to FIG. 1E are schematic cross-sectional views of a manufacturing method of an electronic device according to the first embodiment of the disclosure.

The disclosure may be understood by referring to the following detailed description with reference to the accompanying drawings. It is noted that for comprehension of the reader and simplicity of the drawings, in the drawings of the disclosure, only a part of the electronic device is shown, and specific elements in the drawings are not necessarily drawn to scale. Moreover, the quantity and the size of each element in the drawings are only schematic and are not intended to limit the scope of the disclosure.

In the following specification and claims, the terms "including", "containing", "having", etc., are open-ended terms, so they should be interpreted to mean "including but not limited to . . . ".

It should be understood that when an element or a film layer is described as being "on" or "connected to" another element or film layer, it may be directly on or connected to the another element or film layer, or there is an intervening element or film layer therebetween (an indirect situation). When an element is described as being "directly on" or "directly connected" to another element or film layer, there is no intervening element or film layer therebetween.

Although the terms first, second, third . . . can be used to describe a variety of elements, the elements are not limited by this term. This term is only used to distinguish a single element from other elements in the specification. Different terminologies may be adopted in claims, and replaced with the first, second, third . . . in accordance with the order of elements specified in the claims. Therefore, in the following description, the first element may be described as the second element in the claims.

The terms such as "about", "roughly", "substantially", or "approximately" are generally interpreted as being within a range of plus or minus 10% of a given value or range, or as being within a range of plus or minus 5%, plus or minus 3%, plus or minus 2%, plus or minus 1%, or plus or minus 0.5% of the given value or range. The quantity given here is an approximate quantity, i.e., without specific illustration of "about", "roughly", "substantially", or "approximately" the quantity given can still be interpreted as "about", "roughly", "substantially", or "approximately".

In some embodiments of the disclosure, terms such as "connect" and "interconnect" with respect to bonding and connection, unless specifically defined, may refer to two structures that are in direct contact with each other, or may refer to two structures that are indirectly in contact with each other, wherein there are other structures set between these two structures. In addition, the terms that describe joining and connecting may apply to the case where both structures are movable or both structures are fixed. In detail, in the case of indirect electrical connection, there are transistor, capacitors, inductors, other suitable components or a combination of the above components between the end points of one or more component of the circuit. For example, one endpoint of the capacitor and the other endpoint of the capacitor may not contact each other but be indirectly electrically connected each other. On the contrary, in the case of direct electrical connection, the endpoints of components on two circuits are directly connected or connected to each other with a conductor.

In some embodiments of the disclosure, the area, the width, the thickness, or the height of each element, or the distance or the spacing between elements may be measured by an optical microscopy (OM), a scanning electron microscope (SEM), an α-step, an ellipsometer, or other suitable means. Specifically, according to some embodiments, a scanning electron microscope can be configured to obtain a cross-sectional structure image including an element to be measured and to measure the area, the width, the thickness, or the height of each element, or the distance or the spacing between elements.

The electronic device in the disclosure may include a display device, a radio frequency device, or a tiling device, but the disclosure is not limited thereto. The electronic device may be a bendable or flexible electronic device. The electronic device may include, for example, a light emitting diode. The light emitting diode may include, for example, an organic light emitting diode (OLED), a mini LED, a micro LED, or a quantum dot light emitting diode (QD) (e.g., QLED, QDLED), fluorescence, phosphor, other suitable materials, or a combination thereof, but the disclosure is not limited thereto. The electronic device may include variable capacitors, variable resistors, variable inductors, phase shifters, amplifiers, biometric sensors, graphene sensors, other suitable elements, or a combination of the above, but the disclosure is not limited thereto. The radio frequency device may include a frequency selective surface (FSS), an electromagnetic band gap (EBG) structure, an RF-filter, a polarizer, a resonator, an antenna, or a combination of the above, but the disclosure is not limited thereto. The radio frequency device may include a modulation device, which may be, for example, technology used in fields such as communication, radar/lidar, or other suitable fields. In some embodiments, the radio frequency device may include, for example, a phase modulation device, a frequency modulation device, or a combination of the above, but the disclosure is not limited thereto. The antenna device may be, for example, a phase array antenna. The phase array antenna may, for example, adopt analog beamforming technology, digital beamforming technology, or hybrid beamforming technology, but the disclosure is not limited thereto. The tiling device may be, for example, an antenna tiling device, but the disclosure is not limited thereto. It should be noted that the electronic device may be any combinations thereof, but the disclosure is not limited thereto. An electronic device is configured to illustrate the content of the disclosure in the following, but the disclosure is not limited thereto.

It should be noted that in the disclosure, the features of multiple embodiments to be described below may be replaced, recombined, or mixed to form other embodiments without departing from the spirit of the disclosure. The features of multiple embodiments may be used in combination as long as such combination does not depart from the spirit of the disclosure or lead to conflict.

Reference will now be made in detail to the exemplary embodiments of the disclosure, examples of which are illustrated in the accompanying drawings. Whenever possible, the same reference numerals are used to represent the same or similar parts in the accompanying drawings and description.

Figure 1B:
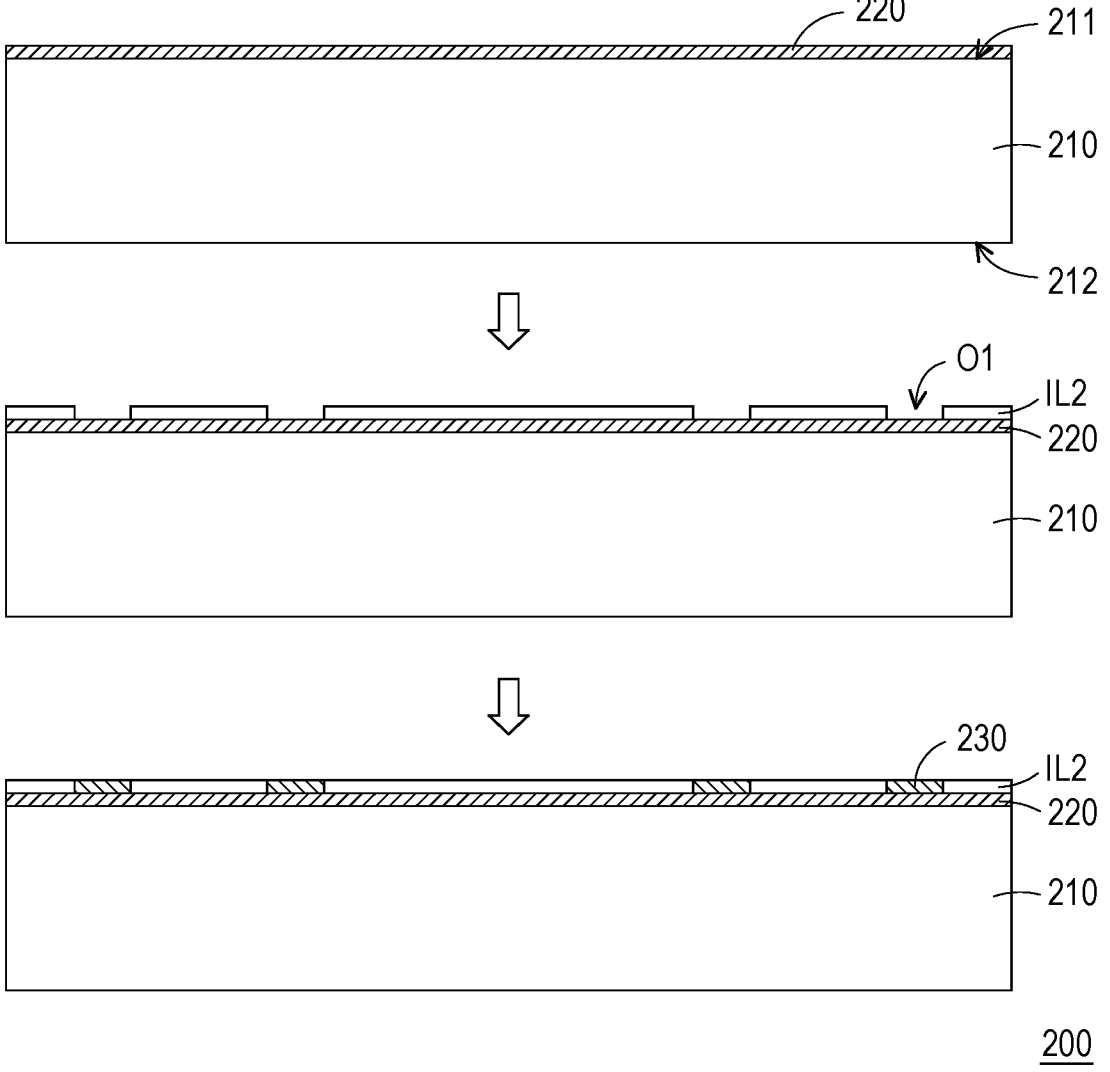
Figure 1C:
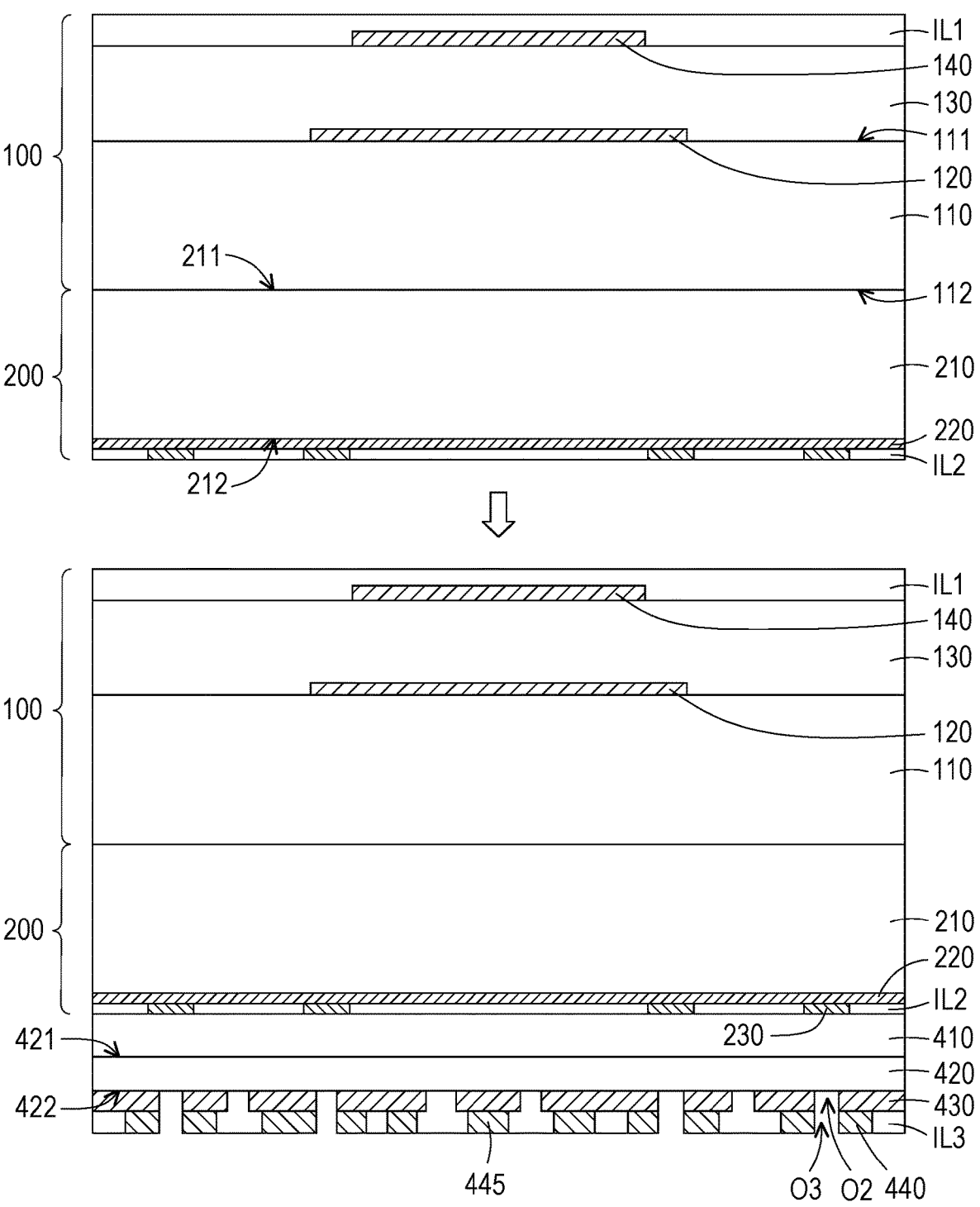
Figure 1D:
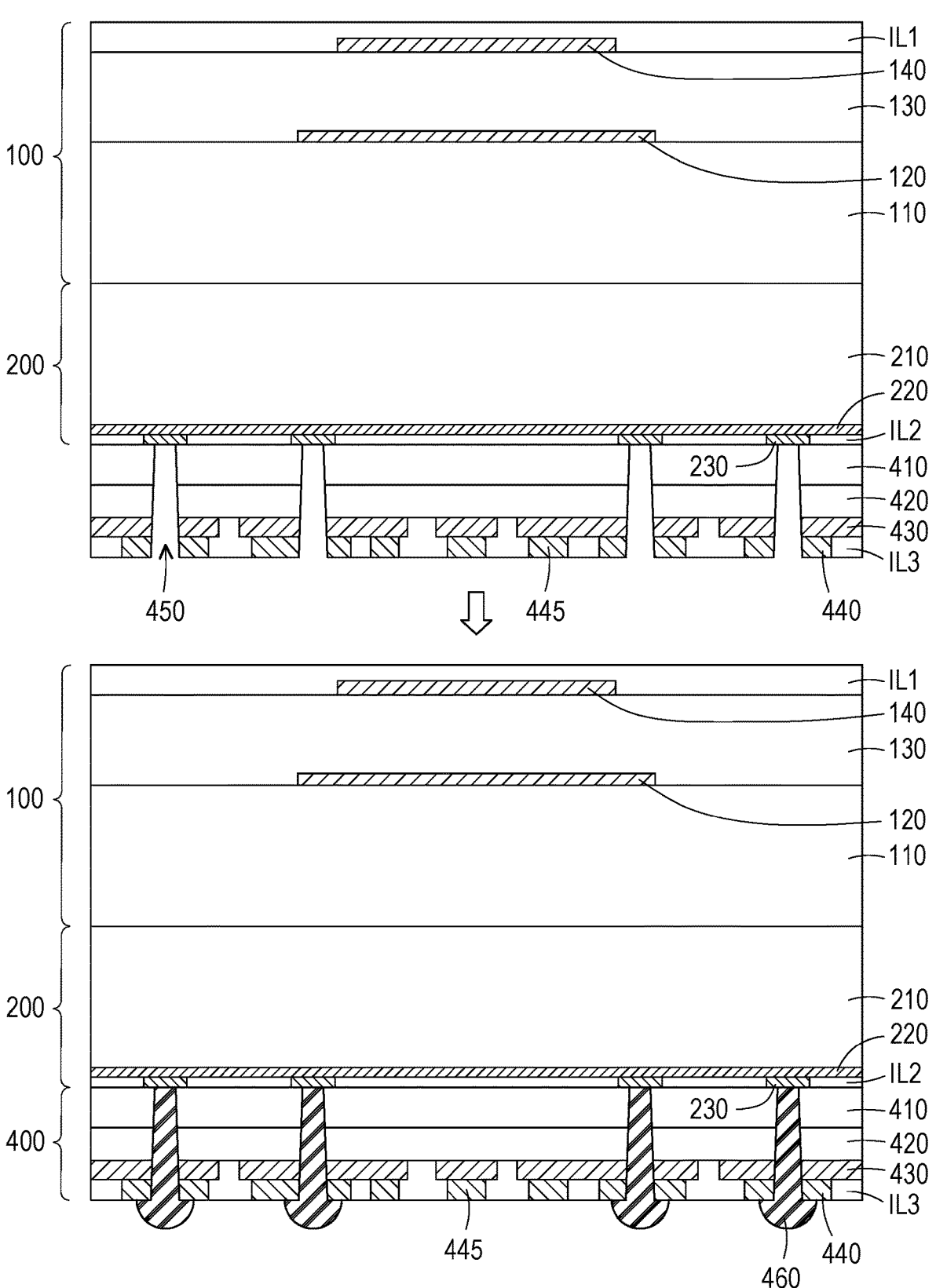
Figure 1E:
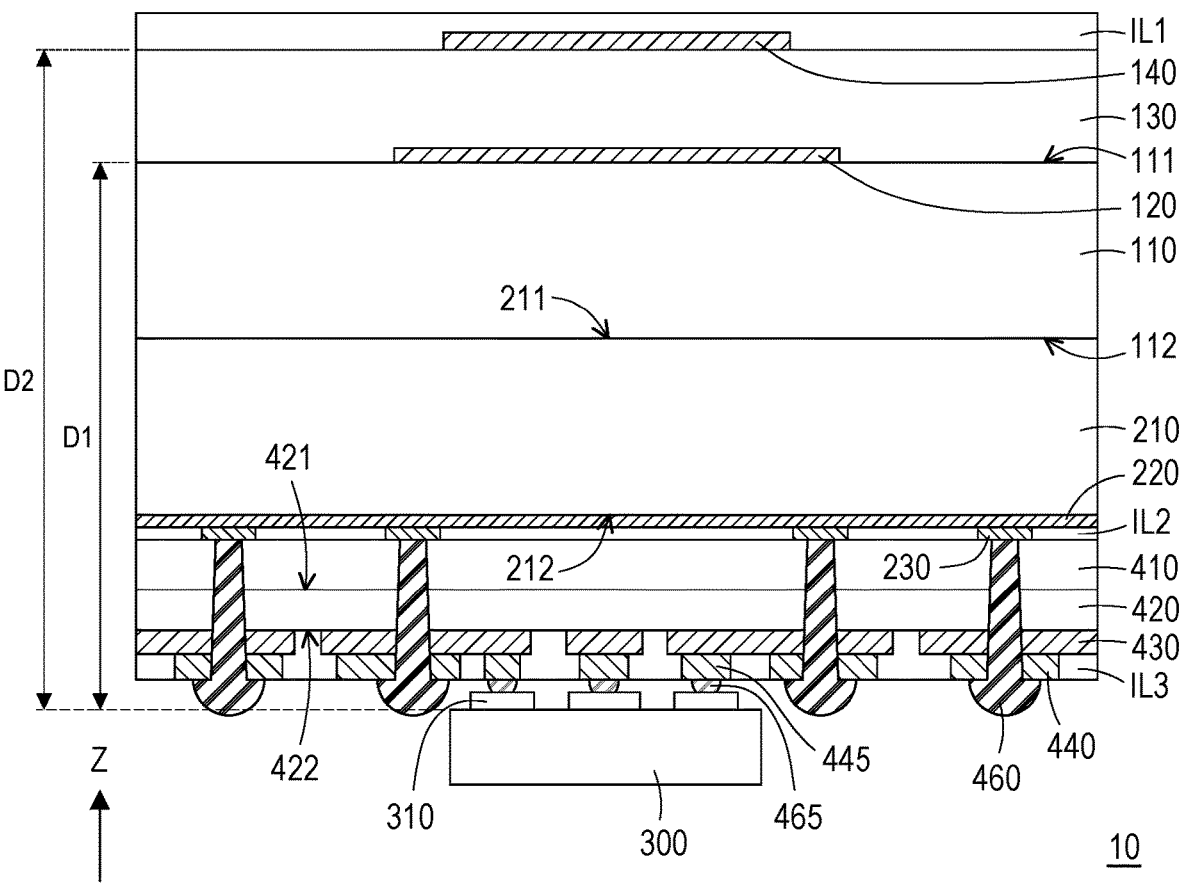

FIG. 1A to FIG. 1E are schematic cross-sectional views of a manufacturing method of an electronic device according to the first embodiment of the disclosure. Referring to FIG. 1E first, an electronic device 10 in this embodiment includes an antenna structure 100, a first circuit structure 200, a chip 300, and a second circuit structure 400.

Specifically, the antenna structure 100 includes a first dielectric layer 110, a first metal pattern 120, a second dielectric layer 130, a second metal pattern 140, and an insulation layer IL1. The first dielectric layer 110 has a first surface 111 and a second surface 112 opposite to each other. The first metal pattern 120 is disposed on the first surface 111. The second dielectric layer 130 is disposed on the first metal pattern 120. The second dielectric layer 130 may be in direct contact with the first dielectric layer 110. The second metal pattern 140 is disposed on the second dielectric layer 130, and the second metal pattern 140 and the first metal pattern 120 are located on two opposite sides of the second dielectric layer 130 respectively. The insulation layer IL1 is disposed on the second metal pattern 140.

In this embodiment, the first metal pattern 120 may overlap the second metal pattern 140 in a normal direction Z of the electronic device 10, and the first metal pattern 120 and the second metal pattern 140 may overlap the chip 300 in the normal direction Z of the electronic device 10.

In this embodiment, a distance D1 between the first metal pattern 120 and the chip 300 may be, for example, less than a distance D2 between the second metal pattern 140 and the chip 300, but the disclosure is not limited thereto. The distance D1 is, for example, a minimum distance measured along the normal direction Z of the electronic device 10 between the first metal pattern 120 and the chip 300, and the distance D2 is, for example, a minimum distance measured along the normal direction Z of the electronic device 10 between the second metal pattern 140 and the chip 300.

In this embodiment, a size of the first metal pattern 120 may be different from a size of the second metal pattern 140. The size of the first metal pattern 120 may be, for example, greater than the size of the second metal pattern 140, but the disclosure is not limited thereto.

In this embodiment, a pattern of the first metal pattern 120 may be different from a pattern of the second metal pattern 140, but the disclosure is not limited thereto.

In this embodiment, when the electronic device 10 is an antenna device, the first metal pattern 120 and the second metal pattern 140 may be regarded as a first antenna and a second antenna that may emit electromagnetic waves respectively, and the chip 300 may be regarded as a radio frequency chip. Since the distance D1 between the first metal pattern 120 and the chip 300 is different from the distance D2 between the second metal pattern 140 and the chip 300, since the size of the first metal pattern 120 is different from the size of the second metal pattern 140, or since the pattern of the first metal pattern 120 is different from the pattern of the second metal pattern 140, the first metal pattern 120 and the second metal pattern 140 may respectively emit electromagnetic waves of different frequency bands (or frequencies), thereby increasing a bandwidth that the antenna device may emit to achieve broadband requirements. For example, when the distance D1 between the first metal pattern 120 and the chip 300 is less than the distance D2 between the second metal pattern 140 and the chip 300, the first metal pattern 120 may be the first antenna that emits low-frequency electromagnetic waves, and the second metal pattern 140 may be the second antenna that emits high-frequency electromagnetic waves. When the size of the first metal pattern 120 is greater than the size of the second metal pattern 140, the first metal pattern 120 may be the first antenna that emits the low-frequency electromagnetic waves, and the second metal pattern 140 may be the second antenna that emits the high-frequency electromagnetic waves. However, the disclosure is not limited thereto.

The first circuit structure 200 is disposed on the antenna structure 100. The first circuit structure 200 includes a third dielectric layer 210, a first conductive layer 220, a first pad 230, and an insulation layer IL2. The third dielectric layer 210 is disposed on the second surface 112. The third dielectric layer 210 has a third surface 211 and a fourth surface 212 opposite to each other. The third surface 211 faces the second surface 112 of the first dielectric layer 110, and the fourth surface 212 is away from the second surface 112 of the first dielectric layer 110. The third dielectric layer 210 may be in direct contact with the first dielectric layer 110. The first conductive layer 220 is disposed on the fourth surface 212. The first conductive layer 220 may be connected to a ground signal, and the first conductive layer 220 is indirectly electrically connected to the first metal pattern 120 and the second metal pattern 140. The first pad 230 and the insulation layer IL2 are disposed on the first conductive layer 220, and the first pad 230 and the third dielectric layer 210 are respectively located on two opposite sides of the first conductive layer 220.

The second circuit structure 400 is disposed on the first circuit structure 200, and the second circuit structure 400 and the antenna structure 100 are respectively located on two opposite sides of the first circuit structure 200. The second circuit structure 400 includes a fourth dielectric layer 410, a fifth dielectric layer 420, a second conductive layer 430, a second pad 440, a third pad 445, a through hole 450, and a conductive member 460. The fourth dielectric layer 410 is disposed on the first pad 230 and the insulation layer IL2. The fifth dielectric layer 420 is disposed on the fourth dielectric layer 410. The fifth dielectric layer 420 has a fifth surface 421 and a sixth surface 422 opposite to each other, and the fifth surface 421 faces the fourth dielectric layer 410. The fifth dielectric layer 420 may be in direct contact with the fourth dielectric layer 410. The second conductive layer 430 is disposed on the sixth surface 422 of the fifth dielectric layer 420. The second pad 440 and the third pad 445 are disposed on the fifth dielectric layer 420 and the second conductive layer 430, so that the second conductive layer 430 may be disposed between the second pad 440 and the fifth dielectric layer 420. The second pad 440 and the third pad 445 may be in contact with and electrically connected to the second conductive layer 430. The second pad 440 may be electrically connected to the first pad 230 through the conductive member 460. The through hole 450 penetrates through fourth the dielectric layer 410, the fifth dielectric layer 420, the second conductive layer 430, and the second pad 440. The conductive member 460 is disposed on the second pad 440 and in the through hole 450. The conductive member 460 may be in contact with and electrically connected to the first pad 230 and the second pad 440. The conductive member 460 may overlap the first pad 230 in the normal direction Z of the electronic device 10.

In some not-shown embodiments, other metal patterns or circuit layers may be disposed between the fourth dielectric layer and the fifth dielectric layer to provide power signals or digital signals, etc., but the disclosure is not limited thereto.

In this embodiment, the conductive member 460 may surround the chip 300 and may be connected to the ground signal through the first pad 230 and the first conductive layer 220, so that it may be used to block the chip 300 from electromagnetic interference (EMI).

The chip 300 is disposed on the first circuit structure 200 and the second circuit structure 400, and the chip 300 and the first circuit structure 200 are respectively located on two opposite sides of the second circuit structure 400. The chip 300 may be electrically connected to the first circuit structure 200. The chip 300 may be, for example, electrically connected to the first conductive layer 220 of the first circuit structure 200 through a conductive member 465, the second conductive layer 430, the conductive member 460, and the first pad 230. In this embodiment, the chip 300 may be used to provide or receive radio frequencies (RF), power signals or digital signals, but the disclosure is not limited thereto.

Referring to FIG. 1A to FIG. 1E, a manufacturing method of the electronic device 10 in this embodiment will be described below. The manufacturing method of the electronic device 10 in this embodiment may include, but is not limited to, the following steps.

First, referring to FIG. 1A, the antenna structure 100 is formed. Specifically, forming the antenna structure 100 may include, for example, the following steps. The first dielectric layer 110 is provided. The first dielectric layer 110 has the first surface 111 and the second surface 112 opposite to each other. Then, the first metal pattern 120 is formed on the first surface 111 to expose a portion of the first dielectric layer 110. Next, the second dielectric layer 130 and the first dielectric layer 110 are bonded, so that the second dielectric layer 130 may cover the first metal pattern 120 and the first dielectric layer 110 exposed by the first metal pattern 120. After that, the second metal pattern 140 is formed on the second dielectric layer 130 to expose a portion of the second dielectric layer 130. Then, the insulation layer IL1 is formed on the second metal pattern 140 to cover the second metal pattern 140 and the second dielectric layer 130 exposed by the second metal pattern 140. So far, the antenna structure 100 has been substantially completed.

Figure 2A:
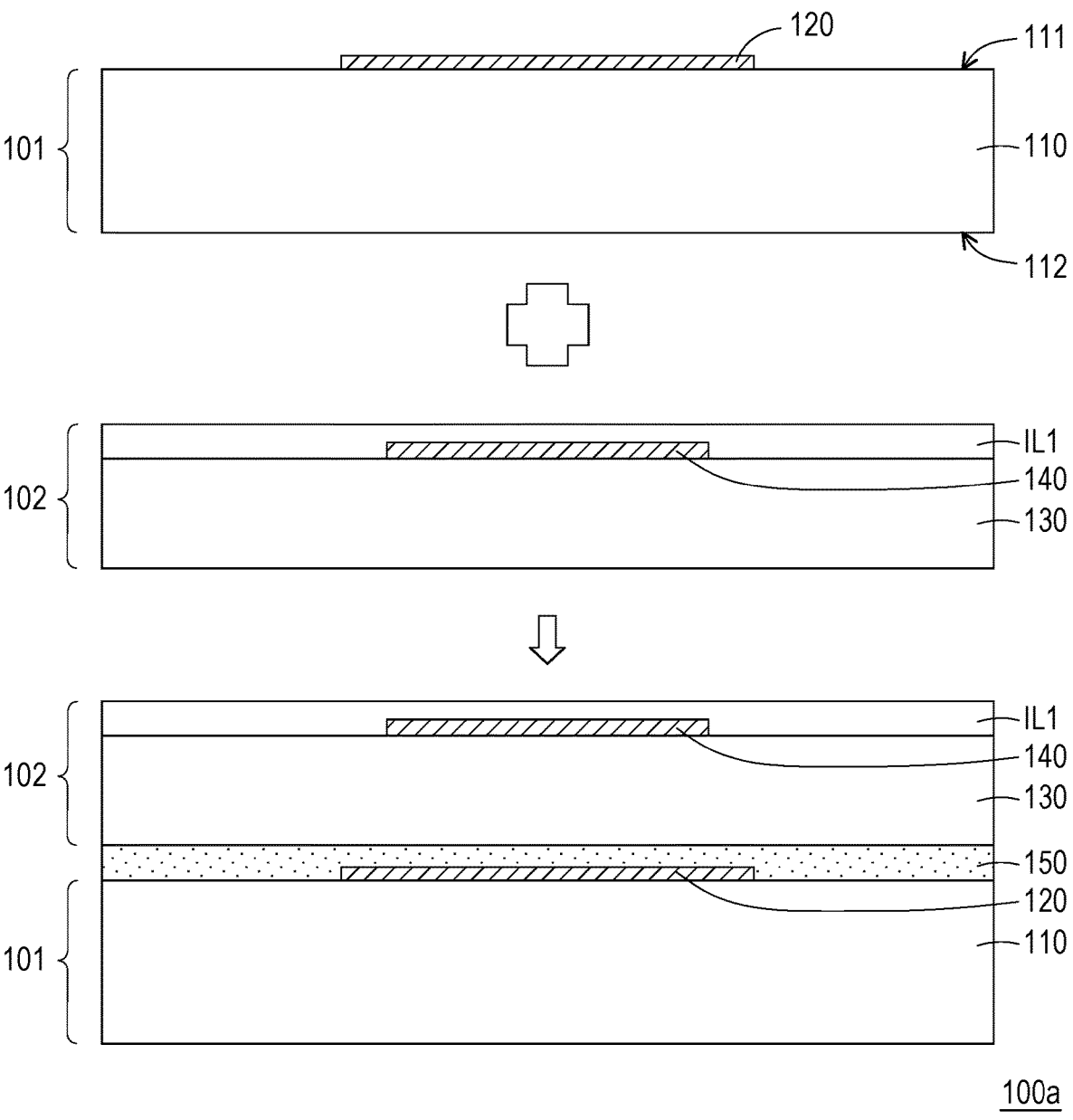
FIG. 2A to FIG. 2B are schematic cross-sectional views of a manufacturing method of an electronic device according to the second embodiment of the disclosure.

In this embodiment, a method of bonding the second dielectric layer 130 and the first dielectric layer 110 is, for example, using a thermal compression process to directly bond the second dielectric layer 130 to the first surface 111 of the first dielectric layer 110, but the disclosure is not limited thereto. In some embodiments, the second dielectric layer may also be indirectly bonded to the first dielectric layer through a solid adhesive material layer (such as colloid or an adhesive layer), as shown in FIG. 2A. In some not-shown embodiments, the second dielectric layer may also be indirectly bonded to the first dielectric layer through a combination of spacer and a filler. For example, the filler is filled into a gap between the second dielectric layer, the spacer, and the first dielectric layer by a one drop filling (ODF) method, and the filler may be solid (such as colloid or an adhesive sheet), liquid (such as water), air, or vacuum. Thicknesses of the adhesive material layer, the spacer, or the filler may be, for example, less than a quarter of a wavelength of the electromagnetic wave that may be emitted by the electronic device 10, so as to reduce interference of the adhesive material layer, the spacer, or the filler on a functional frequency. However, the disclosure is not limited thereto.

Then, referring to FIG. 1B, the first circuit structure 200 is formed. Specifically, forming the first circuit structure 200 may include, for example, the following steps. The third dielectric layer 210 is provided. The third dielectric layer 210 has the third surface 211 and the fourth surface 212 opposite to each other. Then, the first conductive layer 220 is formed on the fourth surface 212 of the third dielectric layer 210. Next, the insulation layer IL2 is formed on the first conductive layer 220. The insulation layer IL2 has an opening O1 to expose a portion of the first conductive layer 220. After that, the first pad 230 is formed on the first conductive layer 220 and in the opening O1, so that the first pad 230 may be in contact with and electrically connected to the first conductive layer 220. So far, the first circuit structure 200 has been substantially completed.

Then, referring to FIG. 1C and FIG. 1D, the antenna structure 100 and the first circuit structure 200 are bonded, and the second circuit structure 400 is formed on the first circuit structure 200. Specifically, bonding the antenna structure 100 and the first circuit structure 200 may include, for example, the following steps. As shown in FIG. 1C, the second surface 112 of the first dielectric layer 110 of the antenna structure 100 is directly bonded to the third surface 211 of the third dielectric layer 210 of the first circuit structure 200 by the thermal compression process, so that the antenna structure 100 may be disposed on the first circuit structure 200. However, the disclosure is not limited thereto. In some embodiments, the antenna structure 100 may also be bonded to the first circuit structure 200 in an indirect bonding manner, such as through a solid adhesive material or a combination of the spacer and the filler.

In this embodiment, forming the second circuit structure 400 on the first circuit structure 200 may include, for example, the following steps. As shown in FIG. 1C, the fourth dielectric layer 410 is formed on the first pad 230 and a surface of the insulation layer IL2 away from the first conductive layer 220. Then, the fifth dielectric layer 420 is formed on a surface of the fourth dielectric layer 410 away from the first pad 230. The fifth dielectric layer 420 has the fifth surface 421 and the sixth surface 422 opposite to each other. Next, the second conductive layer 430 is formed on the sixth surface 422 of the fifth dielectric layer 420. The second conductive layer 430 has an opening O2 to expose a portion of the fifth dielectric layer 420. After that, an insulation layer IL3, the second pad 440, and the third pad 445 are formed on the sixth surface 422 of the fifth dielectric layer 420 and the second conductive layer 430. The second pad 440 has an opening O3 that may be connected to the opening O2. As shown in FIG. 1D, the through hole 450 is formed, so that the through hole 450 may penetrate through the fourth dielectric layer 410, the fifth dielectric layer 420, the second conductive layer 430, and the second pad 440, and expose a portion of the first pad 230. Next, the conductive member 460 is formed on the second pad 440 and in the through hole 450. So far, the second circuit structure 400 has been substantially completed.

In this embodiment, a method of forming the through hole 450 is, for example, to first form the opening O2 and the opening O3 that may expose the fifth dielectric layer 420 by etching during a process of manufacturing the second conductive layer 430, the insulation layer IL3, and the second pad 440, and then drill the fifth dielectric layer 420 exposed by the opening O2 and the opening O3 by a laser to form the through hole 450 that may expose the first pad 230. However, the disclosure is not limited thereto. In some not-shown embodiments, the through hole 450 may also be formed in the following manner. During the process of manufacturing the second conductive layer 430, the insulation layer IL3, and the second pad 440, openings (i.e., the openings O2 and the openings O3) that may expose the fifth dielectric layer 420 are not formed by etching. Then, the second pad 440, the second conductive layer 430, the fifth dielectric layer 420, and the fourth dielectric layer 410 are drilled by the laser to form the through hole 450 that may penetrate through the fourth dielectric layer 410, the fifth dielectric layer 420, the second conductive layer 430, and the second pad 440, and expose the first pad 230.

Then, referring to FIG. 1E, the chip 300 is disposed on the first circuit structure 200 and the second circuit structure 400, so that the chip 300 may be electrically connected to the first circuit structure 200. Specifically, disposing the chip 300 on the first circuit structure 200 and the second circuit structure 400 may include the following steps. The chip 300 is provided. The chip 300 has a pad 310, and the pad 310 is disposed on a surface of the chip 300 facing the second circuit structure 400. Then, the conductive member 465 is formed on the third pad 445, so that the conductive member 465 may be in contact with and electrically connected to the third pad 445. Next, the pad 310 of the chip 300 is bonded to the conductive member 465. So far, the electronic device 10 has been substantially completed.

In this embodiment, materials of the first dielectric layer 110, the second dielectric layer 130, the third dielectric layer 210, the fourth dielectric layer 410, and the fifth dielectric layer 420 may be glass, but the disclosure is not limited thereto. In some embodiments, the materials of the first dielectric layer 110, the second dielectric layer 130, the third dielectric layer 210, the fourth dielectric layer 410, and the fifth dielectric layer 420 may also include printed circuit boards (PCB), low temperature co-fired ceramics (LTCC), liquid crystal polymer (LCP), polyimide (PI), ceramic, plastic film (such as cyclo olefin polymer (COP), polyethylene naphthalate (PEN)), other suitable dielectric materials, or a combination of the foregoing. The materials of the first dielectric layer 110, the second dielectric layer 130, the third dielectric layer 210, the fourth dielectric layer 410, and the fifth dielectric layer 420 may be the same or different.

In this embodiment, the insulation layer IL1, the insulation layer IL2, and the insulation layer IL3 may be a single-layer structure or a multi-layer structure, and materials of the insulation layer IL1, the insulation layer IL2, and the insulation layer IL3 may include, for example, organic materials, inorganic materials. or a combination of the foregoing. However, the disclosure is not limited thereto. The materials of the insulation layer IL1, the insulation layer IL2, and the insulation layer IL3 may be the same or different.

When the first metal pattern and the first conductive layer are respectively formed on two opposite sides of the same dielectric layer, there may be a risk of damage to the metal pattern on one side. Therefore, the manufacturing method in this embodiment is to first form the first metal pattern 120 and the first conductive layer 220 on different dielectric layers, and then combine the different dielectric layers together in a direct bonding or indirect bonding manner, so that there may be at least two or more dielectric layers (such as the first dielectric layer 110 and the third dielectric layer 210) between the first metal pattern 120 and the first conductive layer 220.

Some other embodiments are provided below to describe the invention in detail, where the same reference numerals denote the same or like components, and descriptions of the same technical contents are omitted. The aforementioned embodiment may be referred for descriptions of the omitted parts, and detailed descriptions thereof are not repeated in the following embodiment.

Figure 2B:
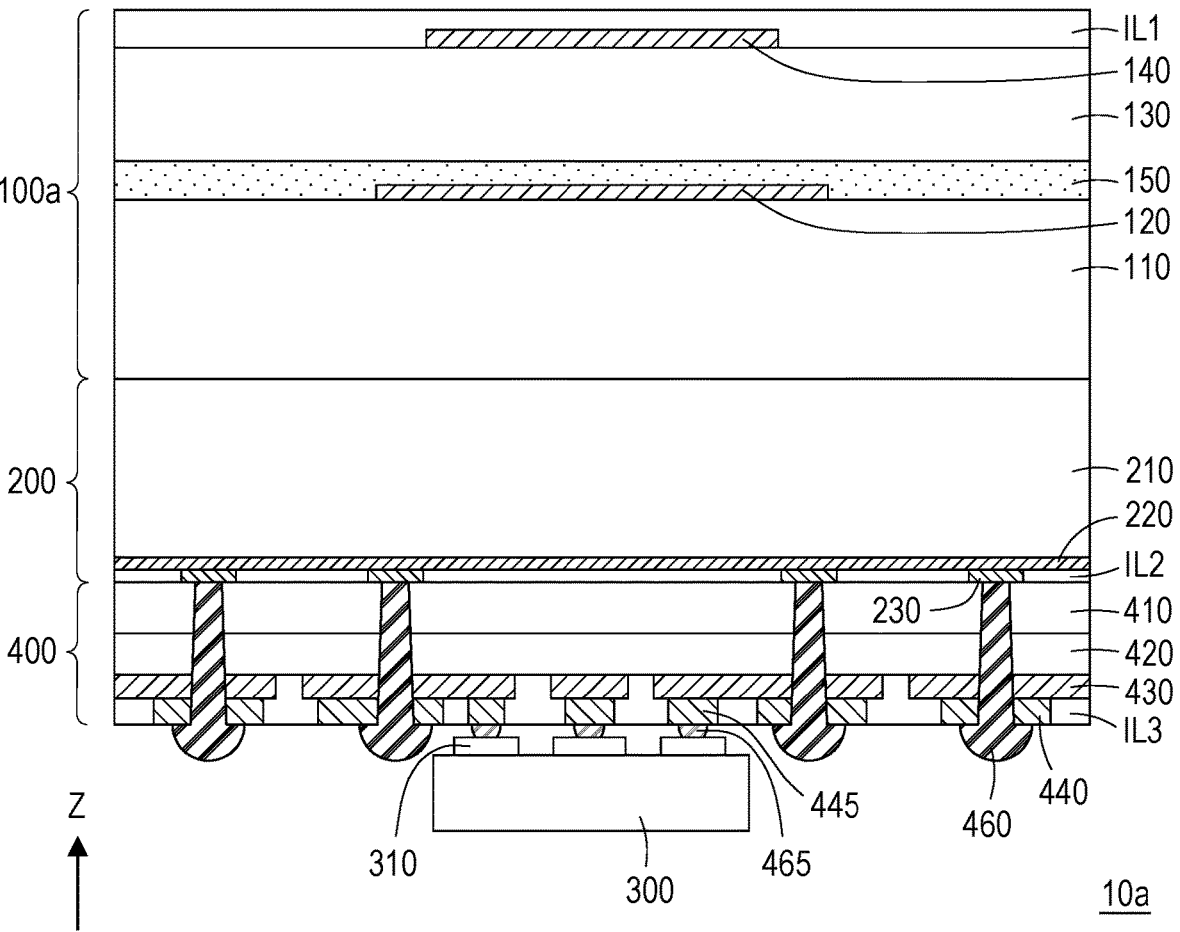

FIG. 2A to FIG. 2B are schematic cross-sectional views of a manufacturing method of an electronic device according to the second embodiment of the disclosure. FIG. 2A replaces the steps in FIG. 1A. FIG. 2B is a continuation of FIG. 1D and replaces the steps in FIG. 1E. The same or similar components in the embodiment of FIG. 2A to FIG. 2B and the embodiment of FIG. 1A to FIG. 1E may be made using the same materials or methods. Therefore, the same and similar descriptions in the two embodiments will not be repeated in the following, and the differences between the two embodiments will be mainly described.

An electronic device 10a in this embodiment is similar to the electronic device 10 in FIG. 1E. However, a difference between the two is that in the electronic device 10a in this embodiment, an antenna structure 100a further includes an adhesive material layer 150. The adhesive material layer 150 is disposed between the second dielectric layer 130 and the first dielectric layer 110.

A manufacturing method of the electronic device 10a in this embodiment may include, but is not limited to, the following steps.

First, referring to FIG. 2A, the antenna structure 100a is formed. Specifically, forming the antenna structure 100a may include, for example, the following steps. The first dielectric layer 110 is provided, and the first metal pattern 120 that may expose the portion of the first dielectric layer 110 is formed on the first surface 111 to obtain a first element 101. Then, the second dielectric layer 130 is provided, and the second metal pattern 140 that may expose the portion of the second dielectric layer 130 is formed on the second dielectric layer 130. Next, the insulation layer IL1 is formed on the second metal pattern 140 to cover the second metal pattern 140 and the second dielectric layer 130 exposed by the second metal pattern 140, so as to obtain a second element 102. After that, the second dielectric layer 130 and the first dielectric layer 110 are indirectly bonded by the adhesive material layer 150, so that the second dielectric layer 130 may be disposed on the first surface 111 of the first dielectric layer 110. So far, the antenna structure 100a has been substantially completed.

Then, in a similar manner to FIG. 1B, the first circuit structure 200 is formed.

Then, in a manner similar to FIG. 1C and FIG. 1D, the antenna structure 100a and the first circuit structure 200 are bonded, and the second circuit structure 400 is formed on the first circuit structure 200.

Then, in a manner similar to FIG. 1E, the chip 300 is disposed on the first circuit structure 200 and the second circuit structure 400, so that the chip 300 may be electrically connected to the first circuit structure 200. So far, the electronic device 10a has been substantially completed.

In this embodiment, by forming the first element 101 and the second element 102 separately, and then indirectly bonding the second dielectric layer 130 and the first dielectric layer 110 by the adhesive material layer 150, it is possible to reduce a warpage issue caused by heating in a process of sequentially forming and stacking the first dielectric layer, the first metal pattern, the second dielectric layer, and the second metal pattern, thereby reducing an issue of resonant frequency shift due to warpage and improve reliability.

Figure 3:
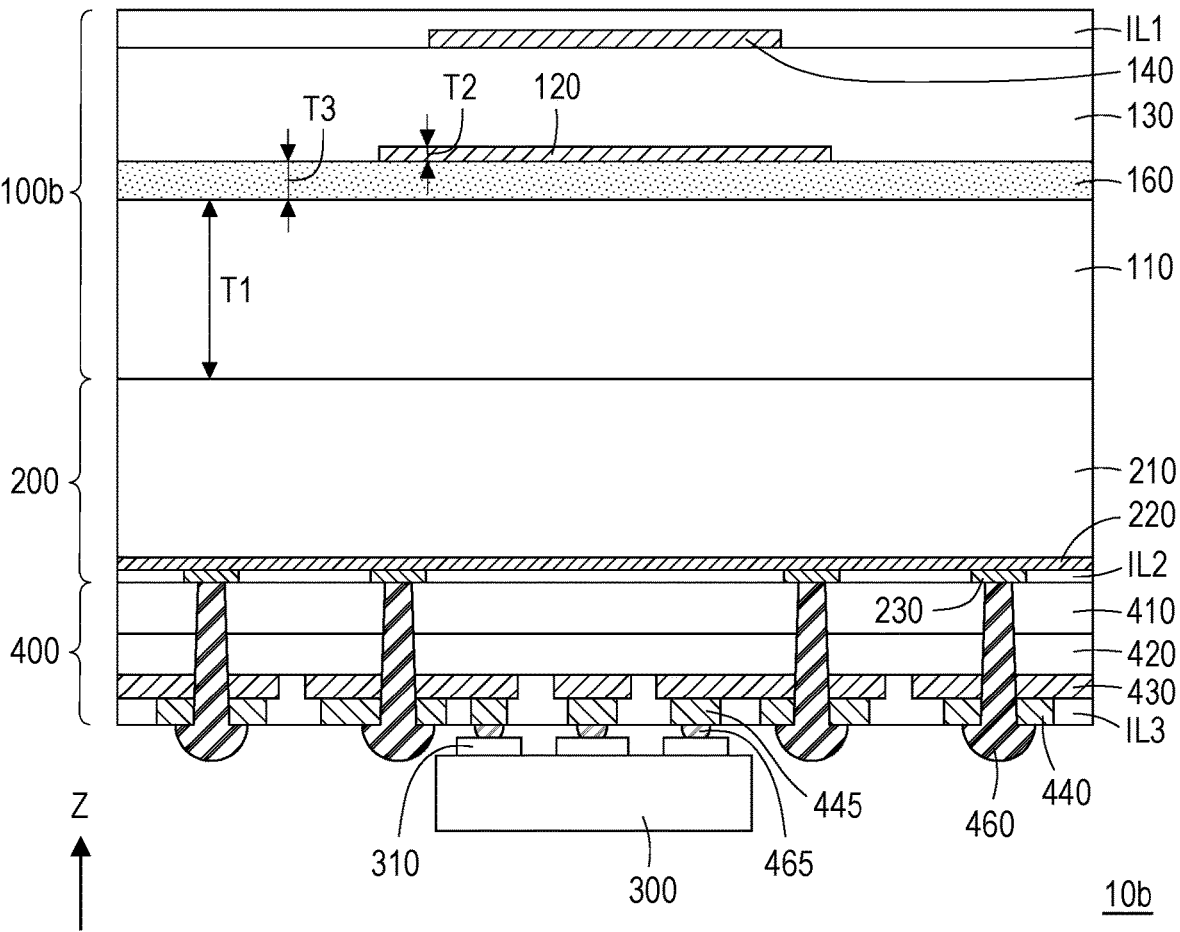
FIG. 3 is a schematic cross-sectional view of an electronic device according to the third embodiment of the disclosure.

FIG. 3 is a schematic cross-sectional view of an electronic device according to the third embodiment of the disclosure. Referring to both FIG. 3 and FIG. 1E, an electronic device 10b in this embodiment is similar to the electronic device 10 in FIG. 1E. However, a difference between the two is that in the electronic device 10a in this embodiment, an antenna structure 100b further includes a first stress adjustment layer 160.

Specifically, referring to FIG. 3, the first stress adjustment layer 160 is disposed between the first metal pattern 120 and the first dielectric layer 110. The first stress adjustment layer 160 may be used to reduce warpage of a stack structure due to stress mismatch (or large difference in coefficients of thermal expansion) between the first metal pattern 120 and the first dielectric layer 110, thereby reducing the issue of resonant frequency shift due to the warpage and improve the reliability.

In this embodiment, the first stress adjustment layer 160 has a coefficient of thermal expansion CTE1. The coefficient of thermal expansion CTE1 of the first stress adjustment layer 160 is, for example, between a coefficient of thermal expansion CTE2 of the first metal pattern 120 and a coefficient of thermal expansion CTE3 of the first dielectric layer 110, but the disclosure is not limited thereto. For example, the coefficient of thermal expansion CTE1 of the first stress adjustment layer 160 may be greater than 5 and less than 14 (i.e., 5<CTE1<14). For example, the coefficient of thermal expansion of the first stress adjustment layer 160 may be 6, 8, 10, or 12, but the disclosure is not limited thereto. In some embodiments, the first stress adjustment layer that may perform an opposite stress state or coefficient of thermal expansion may be disposed according to a stress state or coefficient of thermal expansion of the stack structure when the first stress adjustment layer is not disposed, so as to reduce a chance of warpage of the stack structure.

In other embodiments, the coefficient of thermal expansion CTE1 of the first stress adjustment layer 160 may be greater than the one with a larger coefficient of thermal expansion between the first metal pattern 120 and the first dielectric layer 110. In other embodiments, the coefficient of thermal expansion CTE1 of the first stress adjustment layer 160 may be less than the one with a smaller coefficient of thermal expansion between the first metal pattern 120 and the first dielectric layer 110. However, the disclosure is not limited thereto.

In this embodiment, the first dielectric layer 110 has a thickness T1, the first metal pattern 120 has a thickness T2, and the first stress adjustment layer 160 has a thickness T3. A ratio of the thickness T3 of the first stress adjustment layer 160 to the thickness T1 of the first dielectric layer 110 may be, for example, 0.0001 to 0.01 (i.e., 0.0001≤the ratio≤0.01). For example, the ratio may be 0.0005, 0.001, 0.003, 0.005, and 0.009, but the disclosure is not limited thereto. A ratio of the thickness T3 of the first stress adjustment layer 160 to the thickness T2 of the first metal pattern 120 may be, for example, 0.025 to 4.0 (i.e., 0.025≤the ratio≤4). For example, the ratio may be 0.05, 0.1, 0.5, 1, 2, and 3, but the disclosure is not limited thereto. The thickness T1 is, for example, the thickness of the first dielectric layer 110 measured along the normal direction Z of the electronic device 10. The thickness T2 is, for example, the thickness of the first metal pattern 120 measured along the normal direction Z of the electronic device 10. The thickness T3 is, for example, the thickness of the first stress adjustment layer 160 measured along the normal direction Z of the electronic device 10.

The manufacturing method of the electronic device 10a in this embodiment is similar to the manufacturing method of the electronic device 10 in FIG. 1A to FIG. 1E. However, a difference between the two is that the manufacturing method of the electronic device 10a in this embodiment further includes the following. The first stress adjustment layer 160 is formed between the first metal pattern 120 and the first dielectric layer 110.

Figure 5:
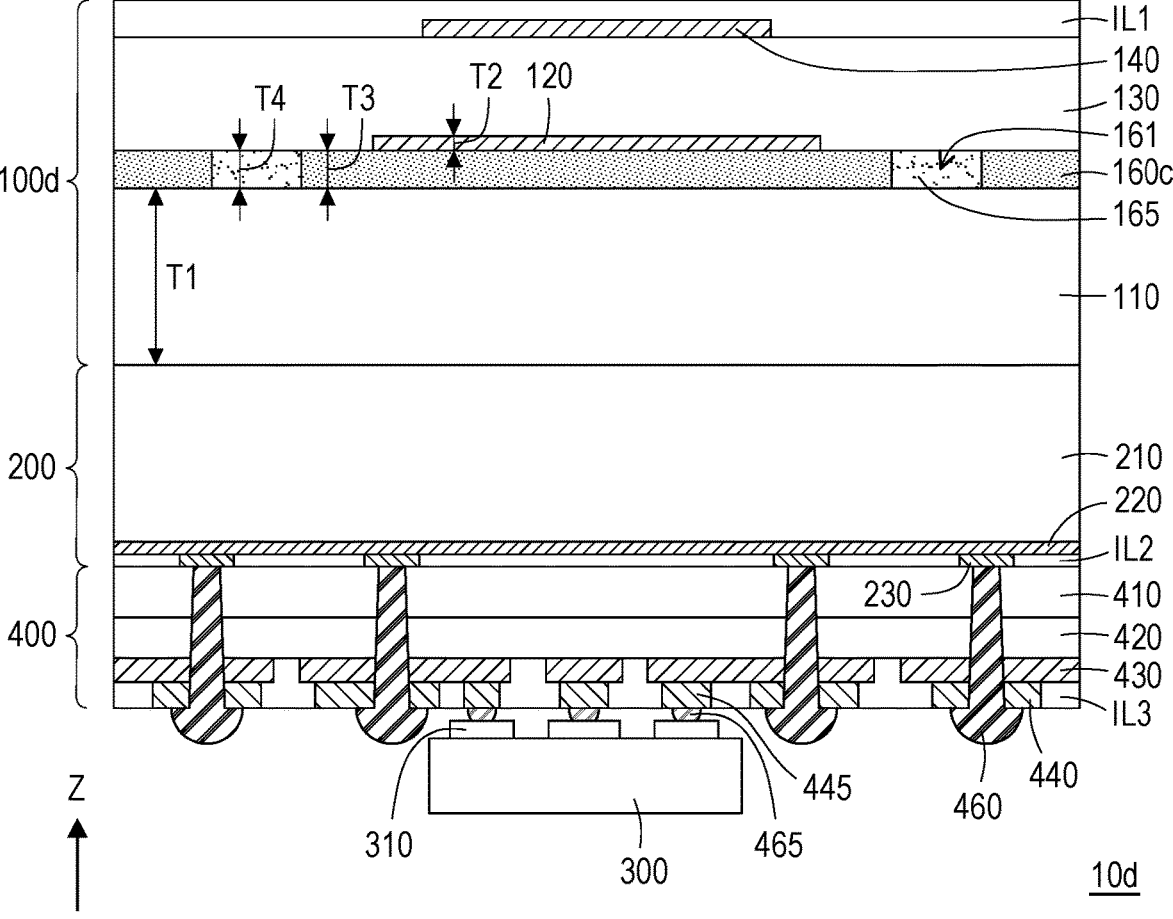
FIG. 5 is a schematic cross-sectional view of an electronic device according to the fifth embodiment of the disclosure.

Although in this embodiment, a stress adjustment layer is disposed between the first metal pattern 120 and the first dielectric layer 110, the disclosure is not limited to the type, quantity, and position of the stress adjustment layer. In some embodiments, two stress adjustment layers with different coefficients of thermal expansion may also be disposed between the first metal pattern 120 and the first dielectric layer 110, as shown in FIG. 5. In some embodiments, another stress adjustment layer may be additionally disposed between the second metal pattern 140 and the second dielectric layer 130 and/or between the third dielectric layer 210 and the first conductive layer 220.

Figure 4:
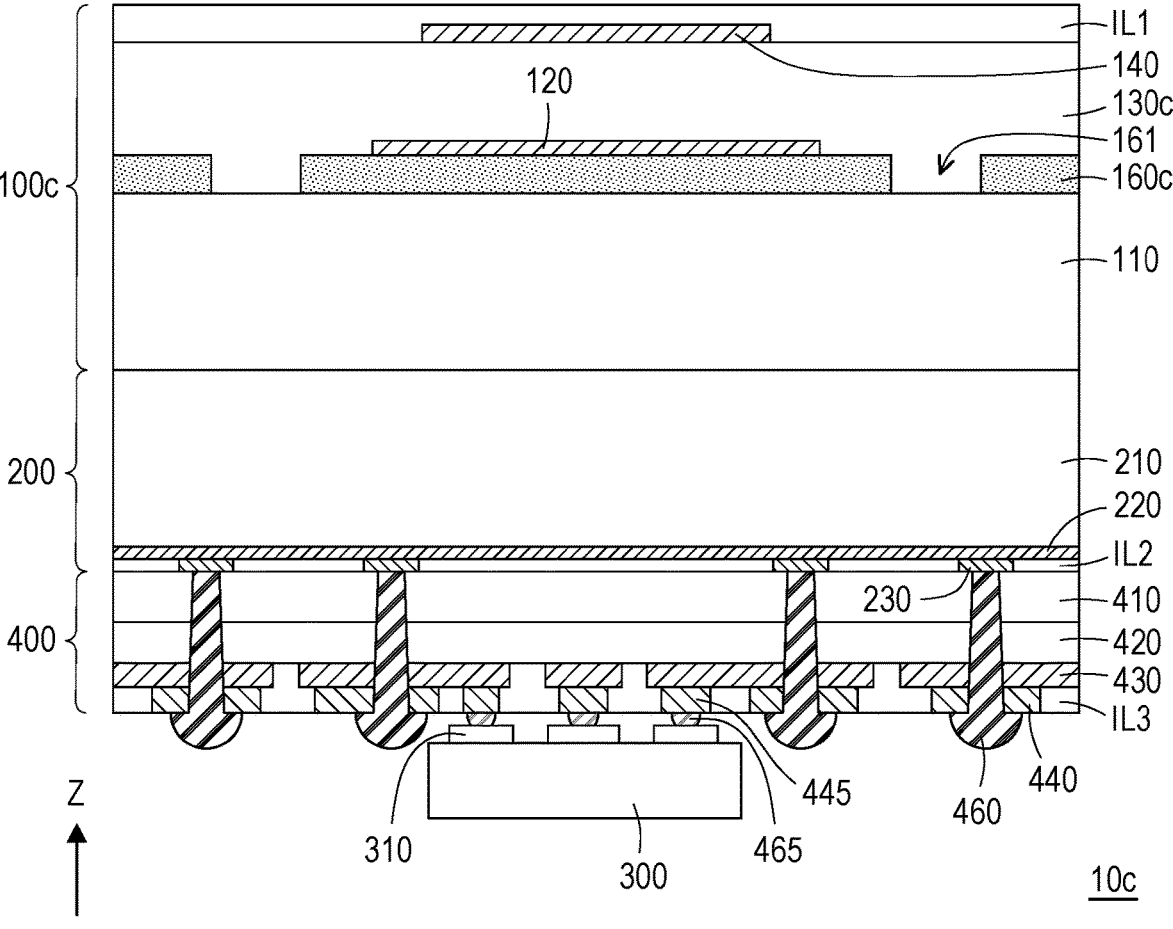
FIG. 4 is a schematic cross-sectional view of an electronic device according to the fourth embodiment of the disclosure.

FIG. 4 is a schematic cross-sectional view of an electronic device according to the fourth embodiment of the disclosure. Referring to both FIG. 4 and FIG. 3, an electronic device 10c in this embodiment is similar to the electronic device 10b in FIG. 3. However, a difference between the two is that in the electronic device 10c in this embodiment, a first stress adjustment layer 160c of an antenna structure 100c is a patterned stress adjustment layer.

Specifically, referring to FIG. 4, the first stress adjustment layer 160c is disposed on the first surface 111 of the first dielectric layer 110. The first stress adjustment layer 160c has an opening 161. The first metal pattern 120 is disposed on the first stress adjustment layer 160c. The second dielectric layer 130c is disposed on the first metal pattern 120 and in the opening 161 of the first stress adjustment layer 160c.

FIG. 5 is a schematic cross-sectional view of an electronic device according to the fifth embodiment of the disclosure. Referring to both FIG. 5 and FIG. 4, an electronic device 10d in this embodiment is similar to the electronic device 10c in FIG. 4. However, a difference between the two is that in the electronic device 10d in this embodiment, an antenna structure 100d further includes a second stress adjustment layer 165.

Specifically, referring to FIG. 5, the second stress adjustment layer 165 is disposed between the first metal pattern 120 and the first dielectric layer 110. The second stress adjustment layer 165 is disposed in the opening 161 of the first stress adjustment layer 160c. The second stress adjustment layer 165 and the first stress adjustment layer 160c are disposed adjacent to each other and arranged at intervals. The second stress adjustment layer 165 may be used to reduce the warpage of the stack structure due to the stress mismatch (or large difference in the coefficients of thermal expansion) between the first metal pattern 120 and the first dielectric layer 110, thereby reducing the issue of resonant frequency shift due to the warpage and improve the reliability.

In this embodiment, the second stress adjustment layer 165 has a coefficient of thermal expansion CTE4. The coefficient of thermal expansion CTE4 of the second stress adjustment layer 165 is, for example, between the coefficient of thermal expansion CTE2 of the first metal pattern 120 and the coefficient of thermal expansion CTE3 of the first dielectric layer 110, but the disclosure is not limited thereto. The coefficient of thermal expansion CTE4 of the second stress adjustment layer 165 is different from the coefficient of thermal expansion CTE1 of the first stress adjustment layer 160c. The coefficient of thermal expansion CTE4 of the second stress adjustment layer 165 may be, for example, greater than or less than the coefficient of thermal expansion CTE1 of the first stress adjustment layer 160c.

In this embodiment, the second stress adjustment layer 165 has a thickness T4, and the thickness T4 of the second stress adjustment layer 165 may be substantially the same as the thickness T3 of the first stress adjustment layer 160. However, the disclosure is not limited thereto. A ratio of the thickness T4 of the second stress adjustment layer 165 to the thickness T1 of the first dielectric layer 110 may be, for example, 0.0001 to 0.01 (i.e., 0.0001≤the ratio≤0.01). For example, the ratio may be 0.0005, 0.001, 0.003, 0.005, and 0.009, but the disclosure is not limited thereto. A ratio of the thickness T4 of the second stress adjustment layer 165 to the thickness T2 of the first metal pattern 120 may be, for example, 0.025 to 4.0 (i.e., 0.025≤the ratio≤4). For example, the ratio may be 0.05, 0.1, 0.5, 1, 2, and 3, but the disclosure is not limited thereto. The thickness T4 is, for example, the thickness of the second stress adjustment layer 165 measured along the normal direction Z of the electronic device 10.

A manufacturing method of the electronic device 10d in this embodiment is similar to a manufacturing method of the electronic device 10b in FIG. 3 or the electronic device 10c in FIG. 4. However, a difference between the two is that the manufacturing method of the electronic device 10d in this embodiment further includes the following. The second stress adjustment layer 165 is formed in the opening 161 of the first stress adjustment layer 160c.

Based on the above, in the electronic device and the manufacturing method thereof in the embodiment of the disclosure, since the distance between the first metal pattern and the chip is different from the distance between the second metal pattern and the chip, since the size of the first metal pattern is different from the size of the second metal pattern, or since the pattern of the first metal pattern is different from the pattern of the second metal pattern, the first metal pattern and the second metal pattern may respectively emit the electromagnetic waves of different frequency bands (or frequencies), thereby increasing the bandwidth that the antenna device may emit to achieve the broadband requirements. In addition, by forming the first element and the second element separately, and then indirectly bonding the second dielectric layer and the first dielectric layer by the adhesive material layer, it is possible to reduce the warpage issue caused by heating in the process of sequentially forming and stacking the first dielectric layer, the first metal pattern, the second dielectric layer, and the second metal pattern. In addition, the configuration of the first stress adjustment layer and/or the second stress adjustment layer may be used to reduce the warpage of the stack structure due to the stress mismatch (or large difference in the coefficients of thermal expansion) between the first metal pattern and the first dielectric layer, thereby reducing the issue of resonant frequency shift due to the warpage and improve the reliability.

Lastly, it is to be noted that: the embodiments described above are only used to illustrate the technical solutions of the disclosure, and not to limit the disclosure; although the disclosure is described in detail with reference to the embodiments, those skilled in the art should understand: it is still possible to modify the technical solutions recorded in the embodiments, or to equivalently replace some or all of the technical features; the modifications or replacements do not cause the essence of the corresponding technical solutions to deviate from the scope of the technical solutions of the embodiments.

What is claimed is:

1. An electronic device, comprising:
an antenna structure, comprising:
    a first dielectric layer having a first surface and a second surface;
    a first metal pattern disposed on the first surface;
    a second dielectric layer disposed on the first metal pattern; and
    a second metal pattern disposed on the second dielectric layer;
a first circuit structure disposed on the antenna structure and comprising:
    a third dielectric layer disposed on the second surface and having a fourth surface away from the second surface;
    a first conductive layer disposed on the fourth surface; and
    a first pad disposed on the first conductive layer;
a chip disposed on the first circuit structure and electrically connected to the first circuit structure; and
a second circuit structure disposed on the first circuit structure and comprising:
    a fourth dielectric layer disposed on the first pad;
    a fifth dielectric layer disposed on the fourth dielectric layer;
    a second pad disposed on the fifth dielectric layer;
    a through hole penetrating through the fourth dielectric layer, the fifth dielectric layer, and the second pad; and
    a conductive member disposed on the second pad and in the through hole,
wherein the first metal pattern is indirectly electrically connected to the first conductive layer,
wherein the second pad is electrically connected to the first pad through the conductive member.

2. The electronic device according to claim 1, wherein the conductive member is in contact with the second pad.

3. The electronic device according to claim 1, wherein the second circuit structure further comprises:
    a second conductive layer disposed between the second pad and the fifth dielectric layer,
    wherein the through hole penetrates through the second conductive layer.

4. The electronic device according to claim 3, wherein the second pad is in contact with the second conductive layer.

5. The electronic device according to claim 3, wherein the chip is electrically connected to the first conductive layer through the second conductive layer, the conductive member, and the first pad.

6. The electronic device according to claim 1, wherein the first metal pattern overlaps the second metal pattern.

7. The electronic device according to claim 1, wherein the second dielectric layer is in direct contact with the first dielectric layer.

8. The electronic device according to claim 1, wherein the antenna structure further comprises:
    an adhesive material layer disposed between the second dielectric layer and the first dielectric layer.

9. The electronic device according to claim 1, wherein the antenna structure further comprises:
    a first stress adjustment layer disposed between the first metal pattern and the first dielectric layer,
    wherein a coefficient of thermal expansion of the first adjustment adjust layer is between a coefficient of thermal expansion of the first metal pattern and a coefficient of thermal expansion of the first dielectric layer.

10. The electronic device according to claim 9, wherein the coefficient of thermal expansion of the first stress adjustment layer is greater than 5 and less than 14.

11. The electronic device according to claim 9, wherein a ratio of a thickness of the first stress adjustment layer to a thickness of the first dielectric layer is 0.0001 to 0.01.

12. The electronic device according to claim 9, wherein a ratio of a thickness of the first stress adjustment layer to a thickness of the first metal pattern is 0.025 to 4.0.

13. The electronic device according to claim 9, wherein the first stress adjustment layer has an opening, and the antenna structure further comprises:
    a second stress adjustment layer disposed in the opening,
    wherein a coefficient of thermal expansion of the second stress adjustment layer is between the coefficient of thermal expansion of the first metal pattern and the coefficient of thermal expansion of the first dielectric layer.

14. A manufacturing method of an electronic device, comprising:
forming an antenna structure, wherein the antenna structure comprises:
    a first dielectric layer having a first surface and a second surface;
    a first metal pattern disposed on the first surface;
    a second dielectric layer disposed on the first metal pattern; and
    a second metal pattern disposed on the second dielectric layer;
forming a first circuit structure, wherein the first circuit structure comprises:
    a third dielectric layer disposed on the second surface and having a fourth surface away from the second surface;
    a first conductive layer disposed on the fourth surface; and
    a first pad disposed on the first conductive layer; and
bonding the antenna structure and the first circuit structure;
forming a second circuit structure on the first circuit structure, wherein the second circuit structure comprises:
    a fourth dielectric layer disposed on the first pad;
    a fifth dielectric layer disposed on the fourth dielectric layer;
    a second pad disposed on the fifth dielectric layer;
    a through hole penetrating through the fourth dielectric layer, the fifth dielectric layer, and the second pad; and
    a conductive member disposed on the second pad and in the through hole; and
disposing a chip on the first circuit structure, so that the chip is electrically connected to the first circuit structure,
wherein the first metal pattern is indirectly electrically connected to the first conductive layer,
wherein the second pad is electrically connected to the first pad through the conductive member.

15. The manufacturing method according to claim 14, wherein the second circuit structure further comprises:

a second conductive layer disposed between the second pad and the fifth dielectric layer, wherein the through hole penetrates through the second conductive layer.

16. The manufacturing method according to claim 14, wherein the antenna structure further comprises:

an adhesive material layer disposed between the second dielectric layer and the first dielectric layer.

17. The manufacturing method according to claim 14, further comprising:

forming a first stress adjustment layer between the first metal pattern and the first dielectric layer, wherein a coefficient of thermal expansion of the first adjustment adjust layer is between a coefficient of thermal expansion of the first metal pattern and a coefficient of thermal expansion of the first dielectric layer.

18. The manufacturing method according to claim 17, wherein the first stress adjustment layer has an opening, and the manufacturing method further comprises:

forming a second stress adjustment layer in the opening, wherein a coefficient of thermal expansion of the second stress adjustment layer is between the coefficient of thermal expansion of the first metal pattern and the coefficient of thermal expansion of the first dielectric layer.

\* \* \* \* \*